(12) United States Patent
Funderburk

(10) Patent No.: US 6,724,589 B1
(45) Date of Patent: *Apr. 20, 2004

(54) BOAT ELECTRICAL TEST AND ISOLATOR SYSTEM

(76) Inventor: Donald G. Funderburk, 39 Mulberry Bluff Dr., Savannah, GA (US) 31406-3270

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 77 days.

(21) Appl. No.: 09/395,277

(22) Filed: Sep. 13, 1999

(51) Int. Cl.$^7$ ................................................. H02H 3/00
(52) U.S. Cl. ............................ 361/42; 361/45; 361/79
(58) Field of Search ............................. 361/42, 45, 46, 361/79, 91.1, 91.2; 340/635, 638, 653; 324/424, 509, 510, 511, 500; 204/196.01, 196.02, 196.06; 307/95

(56) References Cited

U.S. PATENT DOCUMENTS

| | | | | |
|---|---|---|---|---|
| 3,362,900 A | * | 1/1968 | Sabins ................... 204/196.03 |
| 3,636,409 A | * | 1/1972 | Stephens, Jr. et al. ........ 361/43 |
| 3,769,926 A | * | 11/1973 | Race ...................... 204/196.05 |
| 3,997,818 A | * | 12/1976 | Bodkin ........................ 361/100 |
| 4,117,345 A | * | 9/1978 | Balcom ........................ 307/95 |
| 4,492,878 A | * | 1/1985 | Hamel ......................... 307/127 |
| 4,630,161 A | * | 12/1986 | Seitz ............................ 361/42 |
| 5,477,412 A | * | 12/1995 | Neiger et al. ................. 361/45 |
| 5,574,610 A | * | 11/1996 | Tachick et al. ............... 361/56 |
| 5,627,414 A | * | 5/1997 | Brown et al. ................. 307/95 |
| 5,666,255 A | * | 9/1997 | Muelleman ................. 361/111 |
| 5,745,322 A | * | 4/1998 | Duffy et al. .................. 361/45 |
| 5,748,008 A | * | 5/1998 | Landreth .................... 324/763 |
| 5,840,164 A | * | 11/1998 | Staerzl ........................ 307/95 |

\* cited by examiner

Primary Examiner—Stephen W. Jackson
(74) Attorney, Agent, or Firm—Henry W. Cummings

(57) ABSTRACT

A method and apparatus including indicators and a Ground Fault Current Interrupter (GFCI) are provided to test the marina's power and the boats electrical system load to make sure that both are proper and safe to be inter-connected. A low voltage high impedance ground current path including an oppositely connected pair of typically four silicon diodes in series in each of the pairs, sufficient to raise the voltage to a safe level encompassing the typical combined AC ground fault and DC galvanic currents in a Marina is incorporated. This protects against low level AC ground faults present in the marina, as well as DC current due to the harbor safety ground interconnect between boats in the harbor.

18 Claims, 10 Drawing Sheets

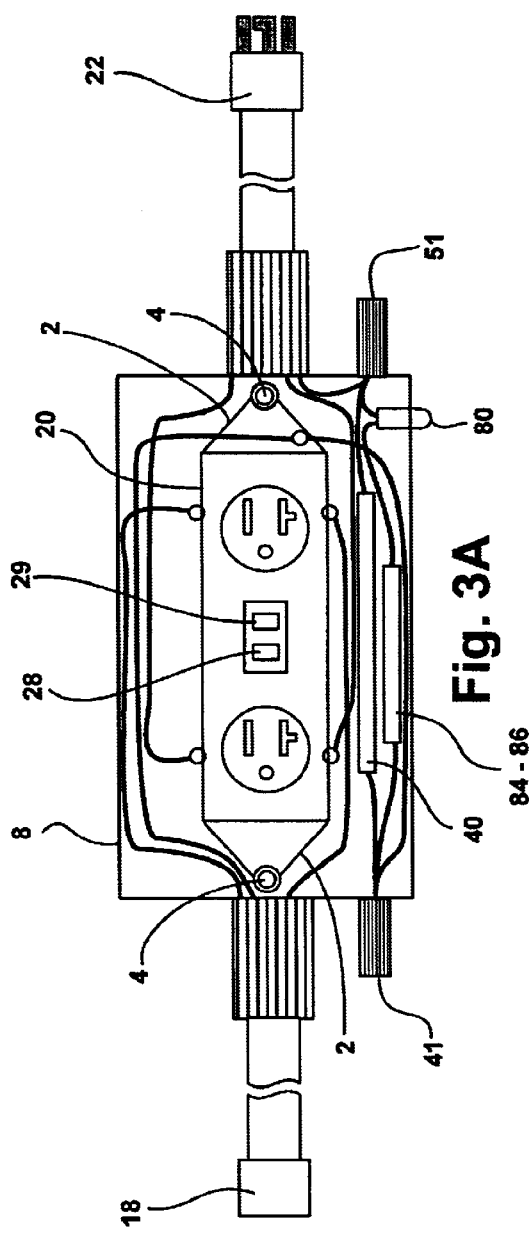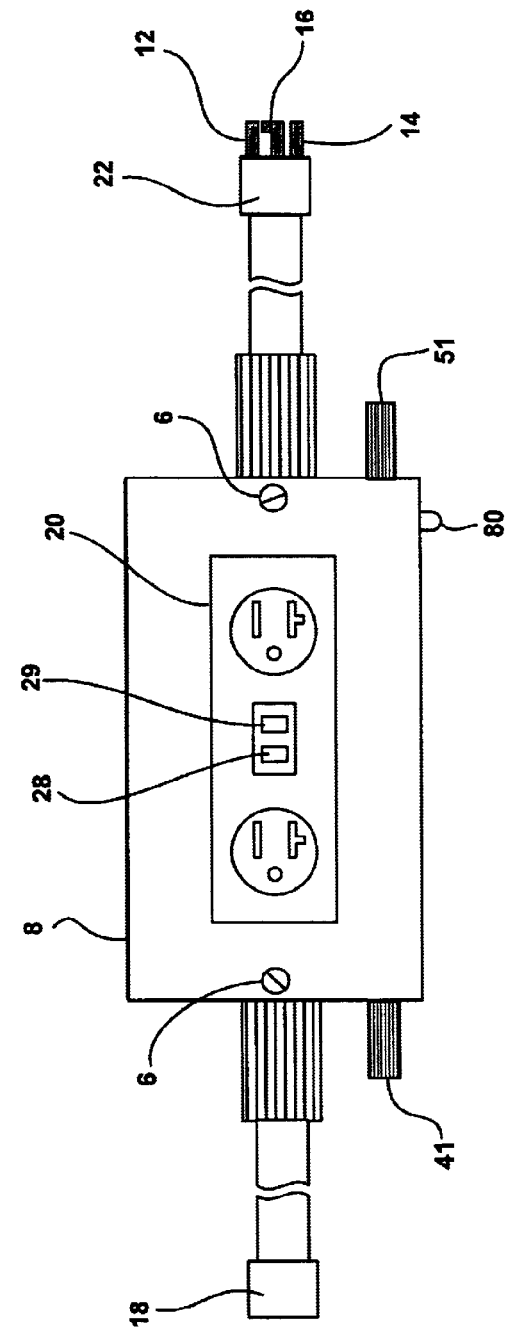

BOAT ELECTRICAL TEST AND ISOLATOR SYSTEM

FIELD OF THE INVENTION

This invention relates to a system for protecting boat's electrical systems and personnel, and prevents degradation to both noble and sacrificial elements on the boat due to both Alternating Current (AC) and external Direct Current (DC) electrical effects. It also protects other boats and personnel at the marina from electrical problems arising within the protected boat. In all of these cases, protection is provided against potentially lethal electric shock to personnel, as well as uncontrolled currents in the marina, boat, and surrounding water that contribute to severe electrolytic corrosion, or externally induced galvanic action.

BACKGROUND OF THE INVENTION

It is normal practice to provide power sources for boats at marinas, which commonly is a 3 or 4 wire AC system for the electrical devices on the boat, including battery charger, lights and other auxiliary devices.

It is also common practice to provide protection for the hull, conductive fittings, paint, and other conductors in and on the boat against corrosion that is commonly called DC galvanic action, which arises, for example, when a metal boat and a dissimilar metal such as the propeller are both in the aqueous, particularly salt seawater solution.

However, problems have arisen concerning these AC and DC boat systems. In many cases the AC power source at the marina is not properly wired and may have power, neutral, and safety ground lines interchanged (commonly called reversed polarity). In many cases the AC system on the boat is not properly wired, or has AC leakage to the boat ground. These problems cause leakage or fault AC currents, which can be life threatening to boat and marina personnel, and cause serious harm or failure to underwater parts and electrical devices on the boat.

The DC systems provided to overcome the galvanic action provided on the boat are frequently interconnected with the AC safety ground. Leakage currents through this path result in accelerated corrosion. AC voltage on the AC safety ground represents a serious electrolysis and safety problem for all boats, marina apparatus and personnel.

These effects cause four types of damage:

First, this interconnect causes all underwater protective active elements (typically zinc's) and the more noble underwater metallic parts of all the boats with a DC ground connected to the AC safety ground wiring in the entire harbor to be hooked together electrically. The result is a very large area electrolytic corrosion network, making the entire harbor into a much larger wide-spread area battery which may rapidly deplete the more active elements. This is caused by the combined effect of galvanic corrosion from all boats.

A second form of damage is electrolytic corrosion caused by introducing harbor AC electrical power commonly connected into the DC ground systems of boats. This arises due to improper wiring, leakage, and AC return line voltage drop that is inducing low levels of AC voltage into the common AC shore power safety ground. This can result in depletion of both the active elements, and the more noble underwater elements of a boat. This type of damage is particularly insidious, because it attacks all through hull fittings, corroding and eventually destroying them, so the boat can easily be subjected to flooding due to failure of the through hull fittings. This phenomenon has reportedly caused unprotected or unmanned boats to sink at the dock. Even wet, normally non-conductive underwater material, like wooden hulls, have been reported to be damaged by this action. It is also a common problem in destroying conductive surfaces including copper based bottom paint. This effect can be visually identified after it has occurred by large numbers of small "pock marks" in the paint when the boat is hauled out of the water.

A third failure mechanism is electrical damage that develops as a result of leakage current unbalance in shore electric power delivered to the boat. This happens when current is being supplied to the boat, but not returning through the intended return line. The unbalanced current can be leaking off through the water into the marina, or through the AC safety ground. This type of fault has reportedly killed persons by electrocution that were swimming, were in or on, or went into the water near a boat with this type of failure. As little as 15 Milliamperes (ma) is considered the safe level of current that a human body can withstand. This type of failure in an otherwise properly wired boat may be caused by movement of electrical contacts touching each other in an electrical distribution panel, or by sea water invading a circuit that is intended to be insulated, but leaks off to ground through the wet area. Some electrical systems, like refrigerators, heaters, air-conditioners, or timer run devices may have faults that do not activate until switched on unexpectedly, long after the operators have departed the boat.

A fourth common damage prevention deficiency is the ability to test, isolate both AC and DC faults and leakage, and document deterioration trends. This can provide identification of a potential problem's existence and point of origin prior to extensive or irrecoverable damage, particularly desirable with the boat in continued operational use.

U.S. Pat. No. 3,362,900 discloses a cathodic protection system in which a transformer 20 together with transistors 48, 50 provide cathodic protection from the boat 110 vac. This is an active DC protection system for balancing out any galvanic current damage to the hull of the protected boat. It is intended to solve the boat's self generated electrolysis effect. However in this system there is no protection for the boat or personnel from AC currents, which may be faulty from the marina power source. The Electrical Test/Isolator (T/I) described herein makes no claim for protection against this type of problem, only against externally induced, or electric fault destructive effects.

U.S. Pat. No. 3,636,409 also utilizes a transformer 2 and a filter system 11 is connected to the boat ground 9. As shown in FIG. 2 the protective system includes a first pair of rectifiers 12 and 13 in series with each other and the second pair of rectifiers 14 and 15 in series with each other and of opposite polarity to rectifiers 14 and 15. Capacitors 16, 17 are in series with each and in parallel with the rectifiers. However this system does not provide protection against faulty AC marina supply systems.

U.S. Pat. No. 3,769,926 is somewhat similar. In FIG. 2 this patent discloses a protective system including opposite polarity diodes 36a, 36b, and 38a, 38b connected in parallel with each other. It is noted that this system does not include the capacitors as were provided in the previous reference system. However this patent provides no protection against faulty AC marina supply sources.

U.S. Pat. No. 4,117,345 includes a ground isolator circuit which monitors the DC provided for galvanic protection, and also monitors the AC circuit between the boat ground connection and the ground connection at the dock. The reference points out that any voltage above about 2.5 volts RMS could conceivably be dangerous when contacted by a person in the water. This system provides protection against DC voltage and thereby prevents externally induced corrosion of the hull of vessels due to electrolysis. It also limits the AC potential between the hull and the shore ground to a level safe for humans, at the stated 2.5 volts RMS potential value. However this reference does not provide corrosion protection below the stated level, or against the AC marina supply system that is faulty for reasons other than externally induced stated levels of the boat to dock ground connection. Further, this is a relatively complicated system with many circuits, parts, and expensive electrical components, resulting in decreased reliability and increased cost. Furthermore the system requires continuous AC or DC power to function properly. Furthermore if the system detects an unsafe level, the system only sounds an alarm, which is typically unmanned on recreational vessels at dock, and does not disconnect the unsafe system.

U.S. Pat. No. 5,627,414 discloses an automatic Marine Cathodic Protection System utilizing galvanic anodes to provide protection against self induced galvanic corrosion. It is primarily an active cancellation system installed internal to the vessel. It appears intended for use on fully staffed large commercial vessels, as opposed to small recreational vessels, where the primary corrosion and safety concerns, and staff availability are different. Commercial vessels are primarily concerned with minimizing self induced corrosion over dispersed, not easily replaced galvanic elements on the vessel itself, primarily at sea, while a primary problem on small recreational boats is prevention of external corrosion effects while in port. An incidental reference to a protective circuit that contains some similar elements to the T/I proposed herein is described on page 8 paragraph 45 through the fourth paragraph of column 9 and referenced in FIG. 5. However, as stated in that claim the purpose is to protect against incidental external DC galvanic action currents. That claim differs from the proposed T/I in that it does not include a GFCI that would provide unbalanced current protection. Further, that claim includes a fuse in the ground line, allowing the possibility of not protecting by the safety ground, while also not indicating low level difficulties due to the large level of voltage anticipated for the major fault indicator identified as 168. Further, It claims to only provide an indicator, or alarm for external stray currents (although not identified in detailed mechanization) and does not protect against those stray currents. The diode string is clearly stated in column 8, paragraph 60, as protection against (apparently plus or minus) DC galvanic current only, which is stated to never exceed 2 volts. The T/I proposed is specifically intended to protect against AC ground voltage presence problems which are well in excess of these levels, as well as the identified DC ground currents. Typical Marina AC ground voltage problem levels may be well in excess of 3 volts peak. This is primarily due to the increasing number offending recreational boats plugged in at marinas. It is specifically noted that the device is a complex electromechanical mechanization with many components, therefore being subject to relatively poor Mean Time Between Failure (MTBF) performance due to large parts count and failure prone moving parts. It is specifically noted that the T/I proposed herein is a simple, reliable device that makes no claim to provide active cancellation. Further, the T/I proposed herein is compatible with shore power operation with U.S. Pat. No. 5,627,414 utilization to provide further performance improvement of that device.

U.S. Pat. No. 5,574,610 specifically claims to allow (AC) fault currents or lightning surge currents to pass freely. Unlike that device, the T/I device herein proposed specifically protects against such faults by disconnecting the AC power, and isolating the low-level voltage. Further, U.S. Pat. No. 5,574,610 discloses a series of stacked diode circuits in each identified configuration, each containing a capacitor used to by-pass AC current into the safety ground system. Unlike that device, the T/I device herein proposed does not include a capacitor, nor propose to allow either AC or DC ground faults to continue unabated, since either can be very destructive. Further, U.S. Pat. No. 5,574,610 column 7 specifically claims to introduce a cathodic DC protection voltage. Unlike that device, the T/I device herein proposed claims no actively introduced galvanic voltages, but rather seeks to passively isolate the offending voltages introduced, even to considerably higher voltage levels that also include AC, the primary offending culprit.

U.S. Pat. No. 5,840,164 provides a system for protecting against galvanic corrosion by providing circuits between the boat ground and the shore ground, each containing a capacitor to by-pass AC safety ground currents. This suffers from the AC limitations identified in other patent reviews above. The reference does not disclose protecting the boat and personnel against faulty marina AC supply sources. Further, U.S. Pat. No. 5,840,164 proposes a high heat dissipation device, requiring protective circuits of relays and thermostats to alleviate the heat load, while allowing damaging corrosion currents to continue destructive action. Unlike that device, the T/I device herein proposed passively seeks to isolate the offending currents with a low heat dissipation implementation. For example, even at the highest level of 1.4 volts quoted in U.S. Pat. No. 5,840,164, the heat dissipated in the proposed T/I device is at the insignificant level of approximately 0.00003 watts. Heat is a major contributor to typical failure mechanisms of any device, particularly solid state devices, thus potentially rendering any device, independent of it's intent or merit, to fail to accomplish it's intended purpose.

U.S. Pat. No. 5,748,008 discloses an electrical integrity test system for boats which provides circuitry for evaluating the integrity of the boat's electrical AC grounding system when the boat is connected to a dock electrical distribution system and the integrity of the boat's galvanic isolator system. If a problem is found the circuitry will activate an alarm to appraise the boat operator of the faulty condition. However it does not disconnect the power and merely sets off an alarm if a problem is detected. Furthermore the system requires continuous AC or DC power to function properly. Furthermore, it is a very complicated system with many circuits, parts, and expensive electrical components, resulting in decreased reliability and increased cost.

The foregoing prior art references are hereby incorporated into the present application by this reference as if fully set forth herein.

SUMMARY OF THE INVENTION

OBJECTS OF THE INVENTION

One object of the present invention is to provide a device and method to determine whether or not a boat and marina's AC and DC circuitry condition is safe for the boat to be connected to a marina's electrical system.

Another object of the present invention is to provide protection against externally induced AC electrolytic corrosion of parts on the boat.

Another object of the present invention is to provide protection of parts of other boats and equipment in a marina against AC and DC induced electrolytic or galvanic corrosion due to the protected boat being connected to the marina.

Another object of the present invention is to provide protection against faulty electrical currents in the marina electrical supply system, which can cause harm to boat equipment.

Another object of the present invention is to provide protection against AC current unbalance faults, which can harm personnel on the boat, in the water or near the marina.

Another object of the present invention is to provide circuitry to allow isolation and testing of the magnitude of any electrical problems with the marina's electrical system, including other boats connected to the Marina electrical supply.

Another object of the present invention is to reduce or eliminate electrocution of personnel, which has caused death and injury to persons in and around marinas.

Another object of the present invention is to reduce or eliminate externally induced electrolytic DC corrosion, commonly called galvanic action.

Another object of the present invention is to reduce or avoid destruction of boats including through hull fittings.

Another object of the present invention is to reduce or avoid the number of boats being sunk.

In accordance with the present invention, a method and apparatus including a ground fault current interrupter is provided to test both the marina's AC power, and the boat electrical system, to make sure that both are of the proper wiring configuration and safe to be connected. A low voltage high impedance current path including a multiplicity of diodes in series to protect against inadvertent low level AC supplied through the marina, and DC current due to the harbor safety ground interconnect between boats in the harbor is also provided. The low voltage high impedance ground current path includes an oppositely connected pair of a series of silicon diodes, in number sufficient to raise the voltage to a safe level encompassing the typical combined AC and DC ground fault in a Marina. Due to increasing numbers of faulty boats and Marinas, that level is sometimes in excess of 2.5 volts. While many non-linear devices could function in this role, at least four series silicon diodes in each of the pairs can be used. Silicon diodes are inexpensive, available, have high surge current tolerance, and are reliable in this application. This configuration protects against low level AC ground faults present in the marina, as well as DC current due to the harbor safety ground interconnect between boats in the harbor. Test points are provided to determine the current that would be flowing through the safety ground had the protection not been installed. The same two test points provide for measurement of the voltage across the diodes without disconnect or movement of the test leads. A calibration is provided whereby the resulting residual current may be determined from the measured voltage.

The marina power to the boat is automatically disconnected and a fault indicated if the AC current supplied to the boat exceeds a predetermined amount of unbalance between the high (hot) and return (neutral, or common) lines due to leakage into either the water or the safety ground line.

In accordance with the present invention, a method and apparatus including tests conducted from the T/I, supplemented by the test devices identified herein, and utilizing the attached Test Procedures, (identified as "Safety Operating Manual for the Electrical Test Isolator" copyright Donald G. Funderburk 2001 attached hereto is hereby incorporated into the present application by this reference as if fully set forth herein. This periodic testing method and apparatus includes an AC "Circuit Tester" provided to initially and periodically test for proper AC power and wiring at the marina AC service connectors. This periodic testing method and apparatuus also includes a "Ground Fault Simulation Tester" (GFST) validation device provided to initially and periodically test for complete safety ground operation and protection.

THE DRAWINGS

FIG. 3A is an interior top plan view of the safety test device of the present invention.

FIG. 3B is an exterior top plan view of the safety test device of the present invention.

DESCRIPTION OF PREFERRED EMBODIMENTS

Figure 1:
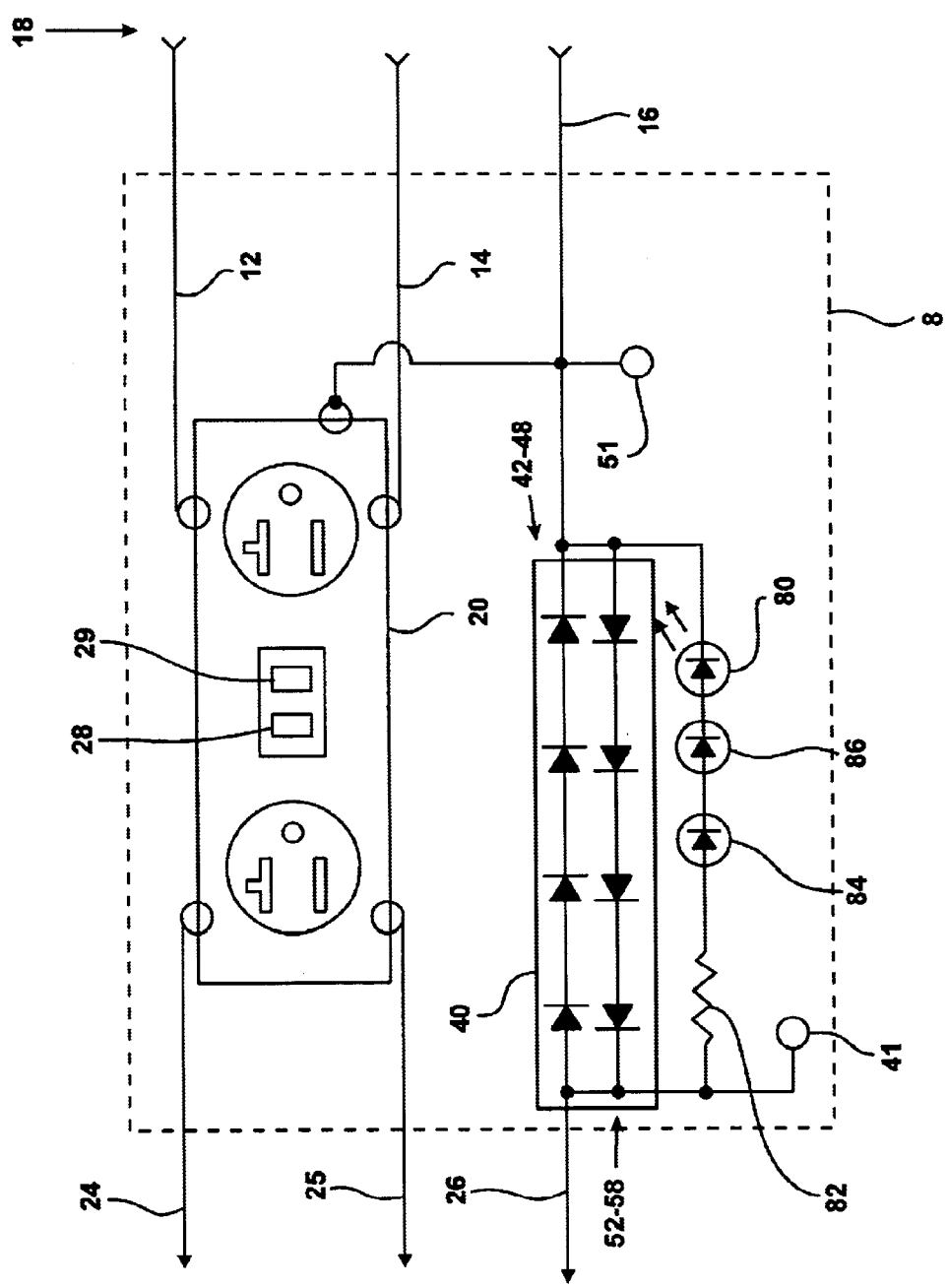
FIG. 1 is an electrical schematic of the safety test device of the present invention.

The T/I device of the present invention is indicated in the schematic diagram FIG. 1. The boat's high potential line 12, return line 14, and safety ground line 16 are connected to a ground fault current interrupter (GFCI) 20 through receptacle 18. The GFCI is a commercially available item and is preferably mounted within a housing 8, which may be encapsulated for electrical insulation protection. Non metallic screws 6 and insulating washers 4 extending through a bracket 2 are mounted on housing 8 to hold the GFCI in place if a metal housing is used. This is to isolate the GFCI/boat safety ground from the Marina commercial power safety ground through the low voltage diode isolator 40. The marina safety ground is connected to one end of the isolator, the safety ground over voltage LED 80, current limiting resistor 72, and Test Point 2 (TP2), 41.

The GFCI includes electrical connectors to receive the marina high potential lead 24, and low potential lead 25, (FIG. 6B) the GFCI safety ground line 26 is connected to the ship safety ground. The GFCI includes a test activation button 28 and a reset button 29 to test the safety of the marina's power interface with the boat. The T/I is provided with a ground over-voltage indicator light assembly 80, with a current limiting resistor, to easily identify severe ground fault voltage presence. The device is also provided with a removable light indicator assembly 200, including lights 204, 214, 224. The light assembly 200 may be purchased as a separate commercially available item.

The low voltage high impedance diode isolator assembly, 40 is connected between the boat ground line 16, and the marina ground line 26. The isolator assembly 40 includes a plurality of diodes 42 to 48 in series, and in parallel with oppositely directed diodes 52 to 58 in series. A marina ground test point is provided at 41 and a boat ground test point is provided at 51. An excess ground voltage/current indicator assembly, consisting of a brightness ballast resistor 82, several indicator level set diodes 84–86, and an LED 80, is included in the ground line between the shore power safety ground line 26 and the ships ground line 16. No fuse is incorporated in the ground line, since it may arguably violate the National Electric Code (NEC) for land based equipment. No such requirement exists for Marine installations. A ground fuse is considered undesirable and in this design unnecessary, since the diode assembly 40 is designed to withstand ground faults compatible with the GFCI and shore power circuit breakers; is a high resistance to low level ground voltages; is resistant to short term high current loads; and in addition, a display is provided for long term ground over-voltage conditions that may occur. Further improvement is included by connecting the axial leads of the diodes in a spiral coil configuration between each series diode. This configuration provides an inductive load to increase the reactive impedance to radio frequency faults, like lightning strikes, through the line. This also provides additional thermal conductivity to help protect the diodes against failure from long term high current faults that go unnoticed on the display of the ground over-voltage indicator. While it may be arguable whether this device is a shore based piece of equipment, or a marine application, since it interfaces the two, this design satisfies both, so the argument is moot.

Figure 2A:
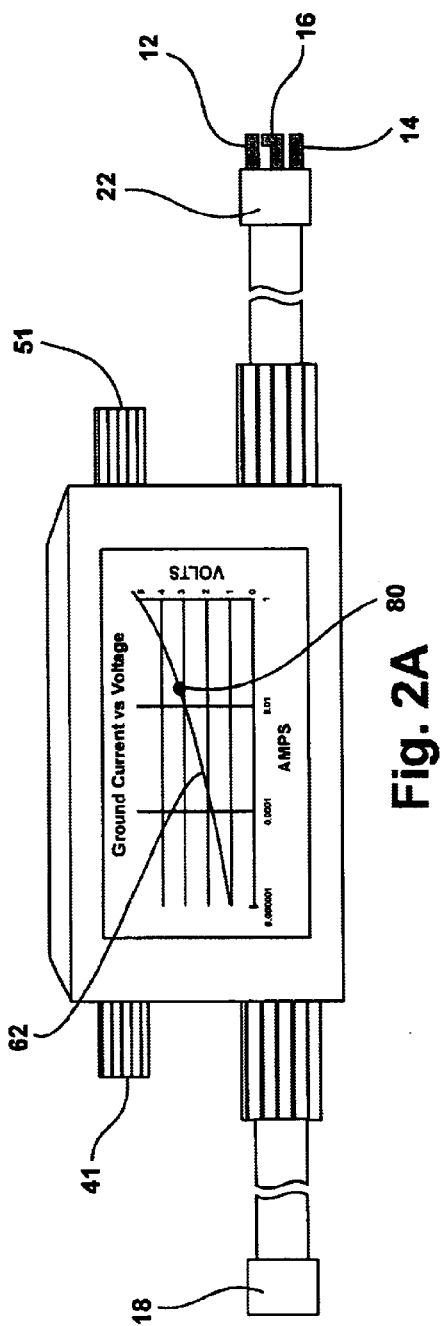
FIG. 2A is a front side elevation view of the safety test device of the present invention.

In use of the device when the boat arrives at a marina, the first thing the boat operator does is to connect the marina power supply into receptacle 22, shown in FIGS. 2A, 3A, 3B. Reset button 29, shown in FIGS. 3A, 3B, and 6B is activated, and the power and ground polarity of the marina power supply is determined by inspection of the plug in indicator assembly 200 shown in FIGS. 7A-7D, as installed in FIG. 9. If the power supply is satisfactory, indicator lights 214 and 224 shown in light. If the marina power is correct, connector 18 may be connected to the boat service connector. This provides continuing protection. More detailed test procedures for fault isolation and electrolysis evaluation, entitled "Operating Manual for the Electrical Test Isolator copyright Donald G. Funderburk 2001 is hereby incorporated into the present application by this reference as if fully set forth herein is included herein by attachment hereto.

As shown in FIG. 1, the low voltage diode isolator 40, isolates both AC and DC leakage voltage on marina power safety ground from boat ground, and thus cannot harm electrical devices on the boat. Both AC and DC voltages are isolated because the diodes 42 to 48 are oppositely directed to diodes 52 to 58, and of sufficient voltage and current to protect against typical safety ground stray AC voltages, which are frequently greater than typical DC voltages.

Figure 6A:
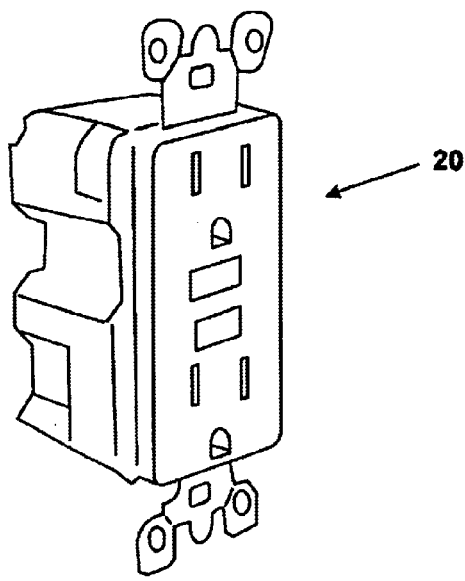
FIG. 6A is a perspective view of a commercially available ground fault current interrupter (GFCI).
Figure 6B:
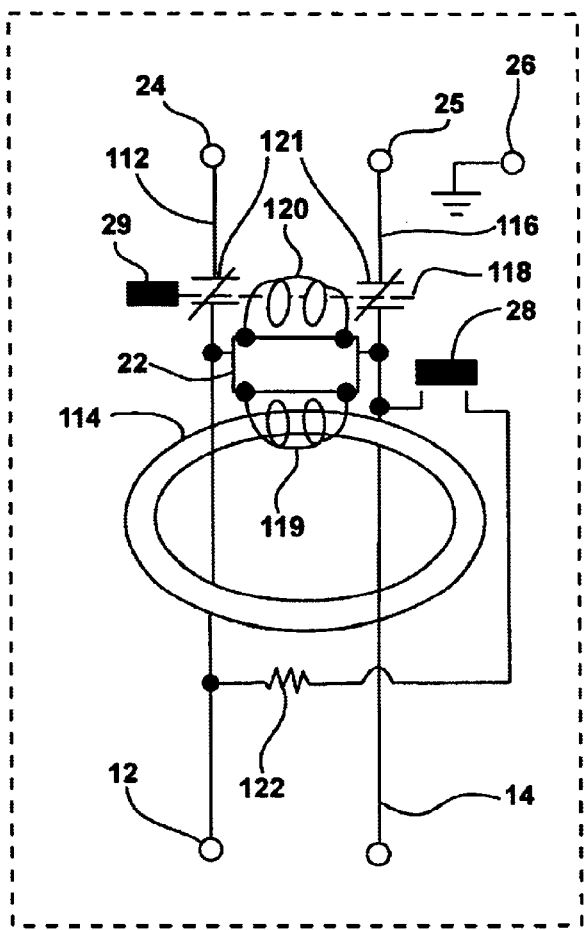
FIG. 6B is a schematic view of a commercially available ground fault current interrupter (GFCI).
Figure 7A:
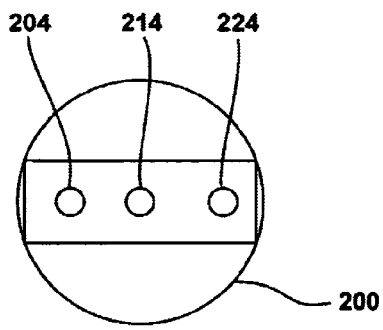
FIG. 7A is a top view drawing of a commercially available plug-in circuit tester to be used in accordance with the present invention.
Figure 7B:
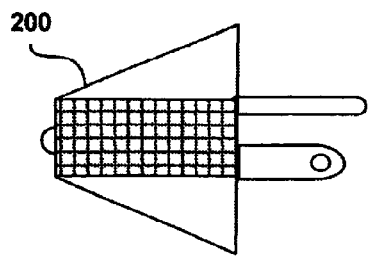
FIG. 7B is a side view drawing of a commercially available plug-in circuit tester to be used in accordance with the present invention.
Figure 7C:
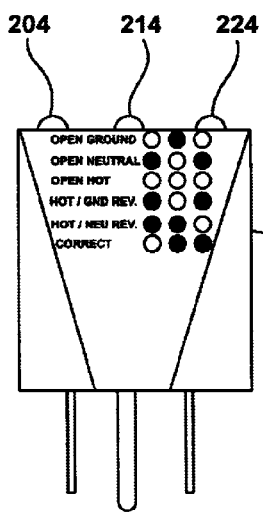
FIG. 7C is a front view drawing of a commercially available plug-in circuit tester to be used in accordance with the present invention.
Figure 7D:
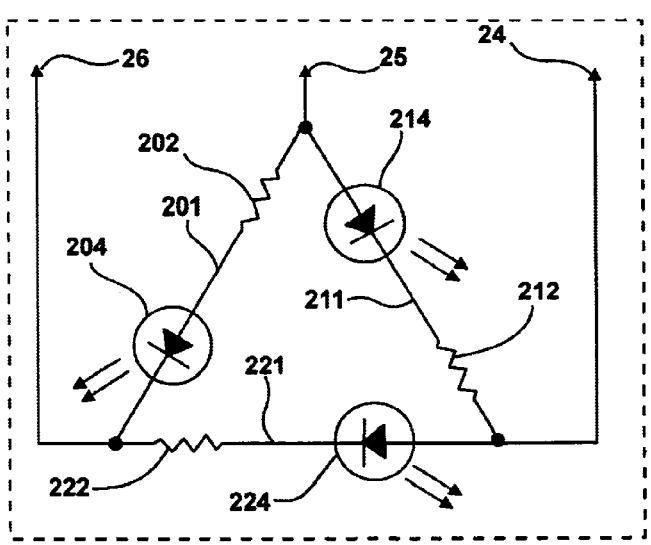
FIG. 7D is a schematic diagram of a commercially available plug-in circuit tester to be used in accordance with the present invention.
Figure 8A:
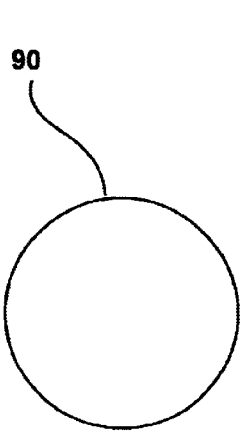
FIG. 8A is a top view drawing of a plug-in GFST device claimed herein.
Figure 8B:
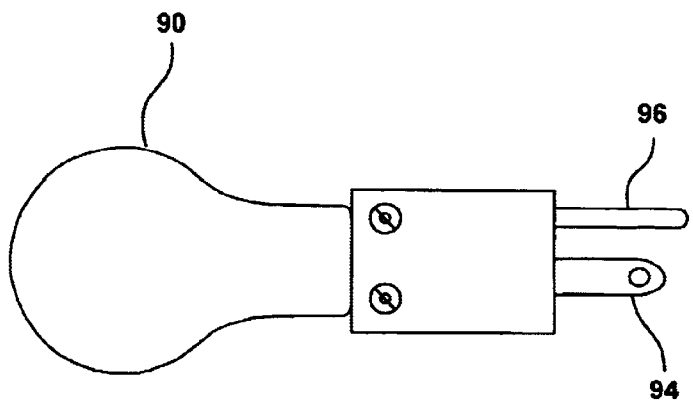
FIG. 8B is a side view drawing of a plug-in GFST device claimed herein.
Figure 8C:
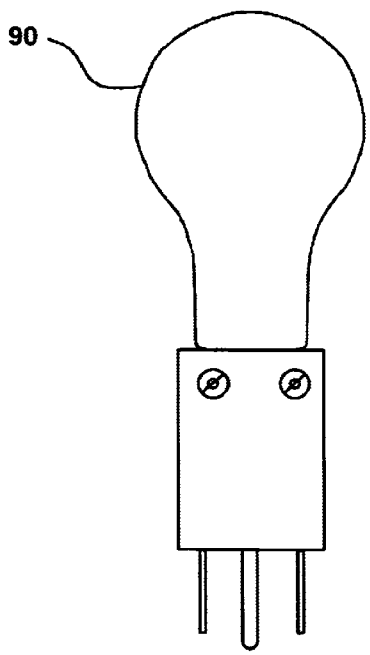
FIG. 8C is a front view drawing of a plug-in GFST device claimed herein.
Figure 8D:
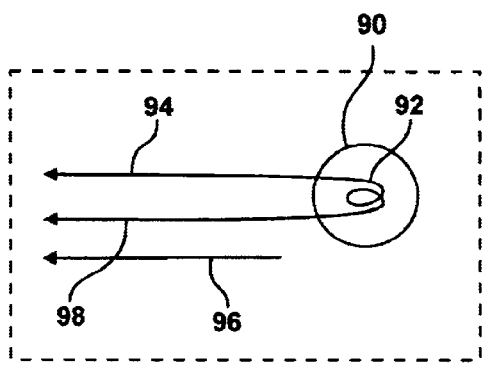
FIG. 8D is a schematc drawing of a plug-in GFST device claimed herein.

As shown in FIGS. 6A and 6B, a sample GFCI circuit, which is commercially available, is illustrated. The circuit typically includes a magnetic core, 114, through which hot supply line 24, and neutral return line 25 pass in opposite directions, through lines 112, 116 thus creating opposing magnetic fields. A sensing coil 119, senses any unbalance in the line, and feeds the output to active driver 22. The driver senses a current unbalance of typically 4 to 10 milliamperes, and activates a trigger current through the coil of solenoid 120. The coil trips an arm 118, which disconnects the spring-loaded contactor portion 121 of solenoid 120. Output high current line 12 and low current line 14 are disconnected on the power output side of the solenoid when the current unbalance exists. The solenoid is connected to a mechanical latching reset button 29, to restore power by resetting the solenoid to the closed position. A spring loaded normally open test switch 28 is supplied as an integral part of the GFCI that shunts sufficient current through resistor 122, (typically about 14 Kilohms) to establish a test unbalance in the supply and return line.

Figure 9:
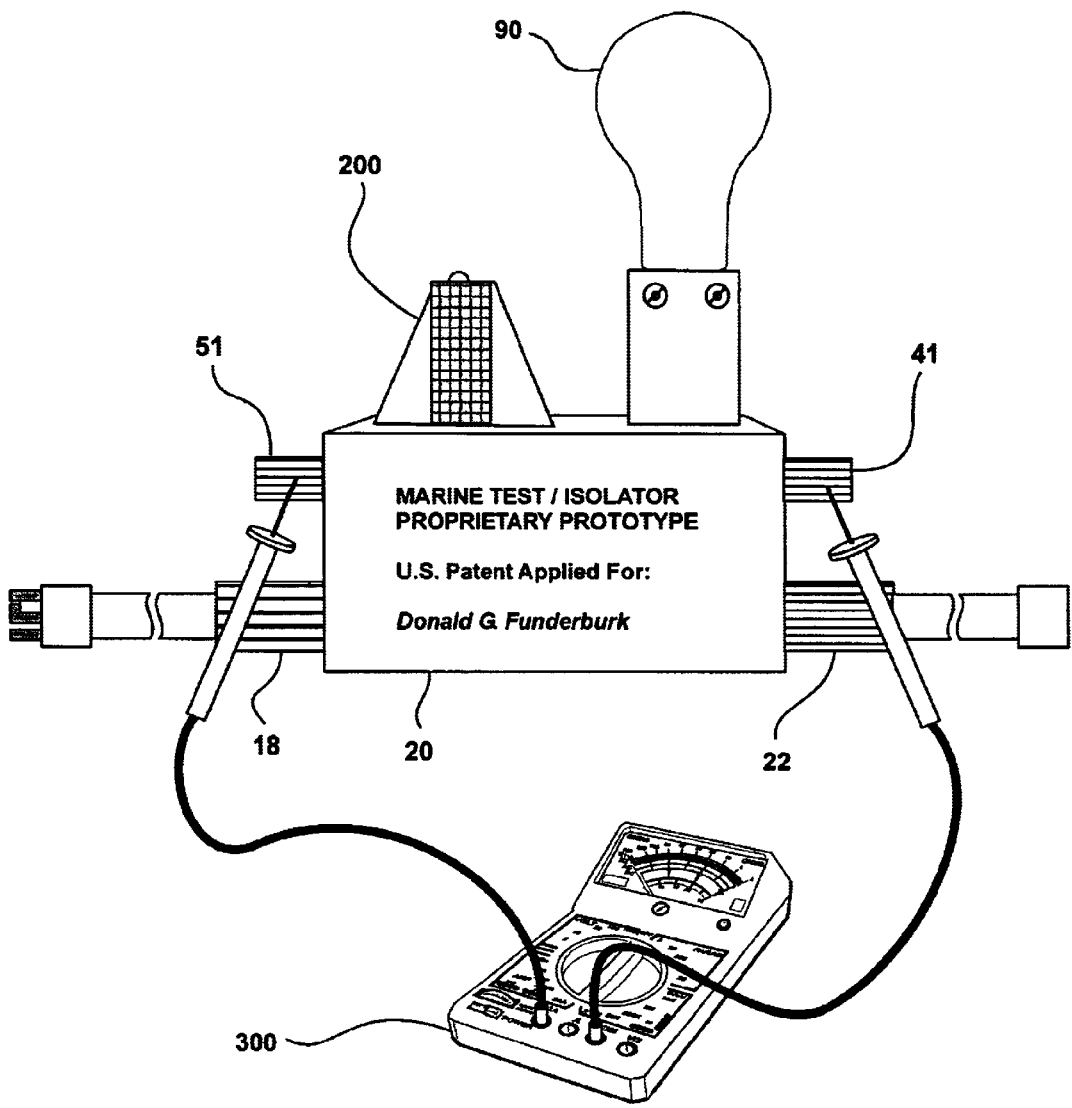
FIG. 9 is an illustration of a test setup configuration of a prototype of the devices identified herein.

A typical commercially available, optional AC circuit tester 200 shown in FIGS. 7A-7D includes a line 201, including a resistor 202, and red Light Emitting Diode (LED) 204; line 211 including green LED 214 and resistor 212; and a third line 221, including resistor 222 and green LED 224. Application use is shown in FIG. 9. For testing that the correct AC marina dock supply lines are connected to line 24 115 volt hot side, line 25 neutral, and line 26 safety ground, the circuit tester is plugged into either of the two matching outlets in the T/I. If the connections are proper, green LED's 214 and 224 illuminate, and red LED 201 remains extinguished. Representative conditions for illuminated combination of lights is shown in accordance with the following typical configuration table.

| Condition: | LED 204 | LED 224 | LED 214 |
| --- | --- | --- | --- |
| Open Ground | OFF | GRN | OFF |
| Open Neutral | RED | OFF | GRN |
| Open hot | OFF | OFF | OFF |
| Hot/Gnd Reversed | RED | OFF | GRN |
| Hot/Neutral Reversed | RED | GRN | OFF |
| Correct | OFF | GRN | GRN |

Figure 2B:
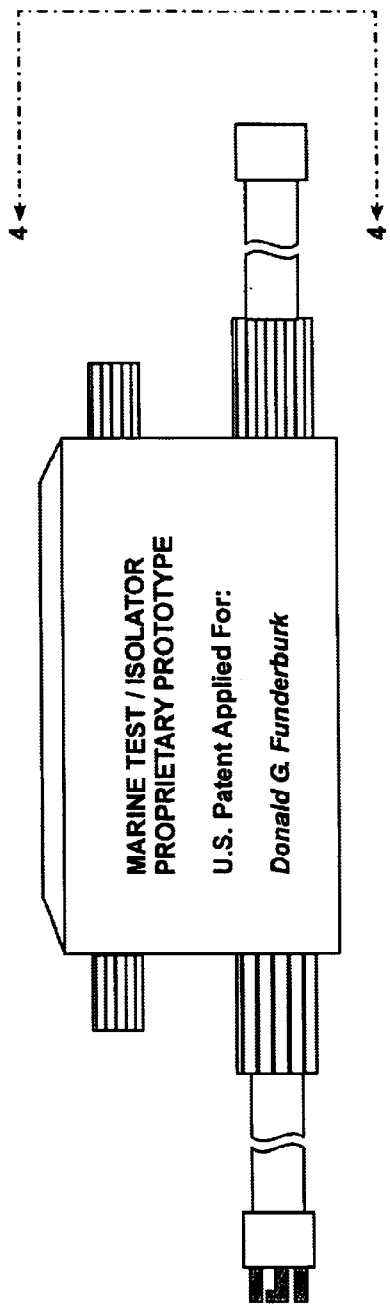
FIG. 2B is a rear side elevation view of the safety test device of the present invention.
Figure 4A:
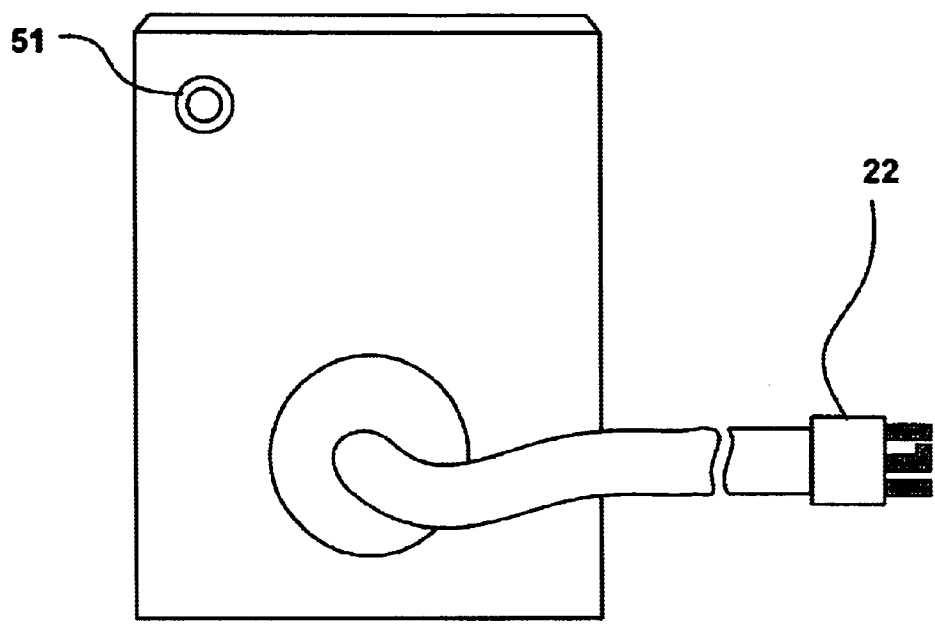
FIG. 4A is an end view of the safety test device of the present invention looking opposite the direction of the arrows along line 4-4 in FIG. 2.
Figure 4B:
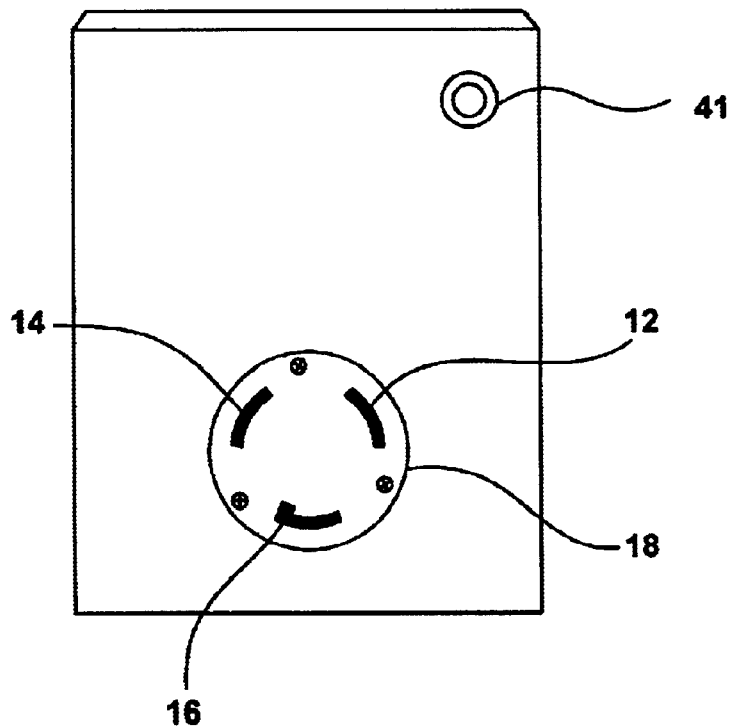
FIG. 4B is an end view of the safety test device of the present invention looking in the direction of the arrows along the line 4-4 in FIG. 2.
Figure 5:
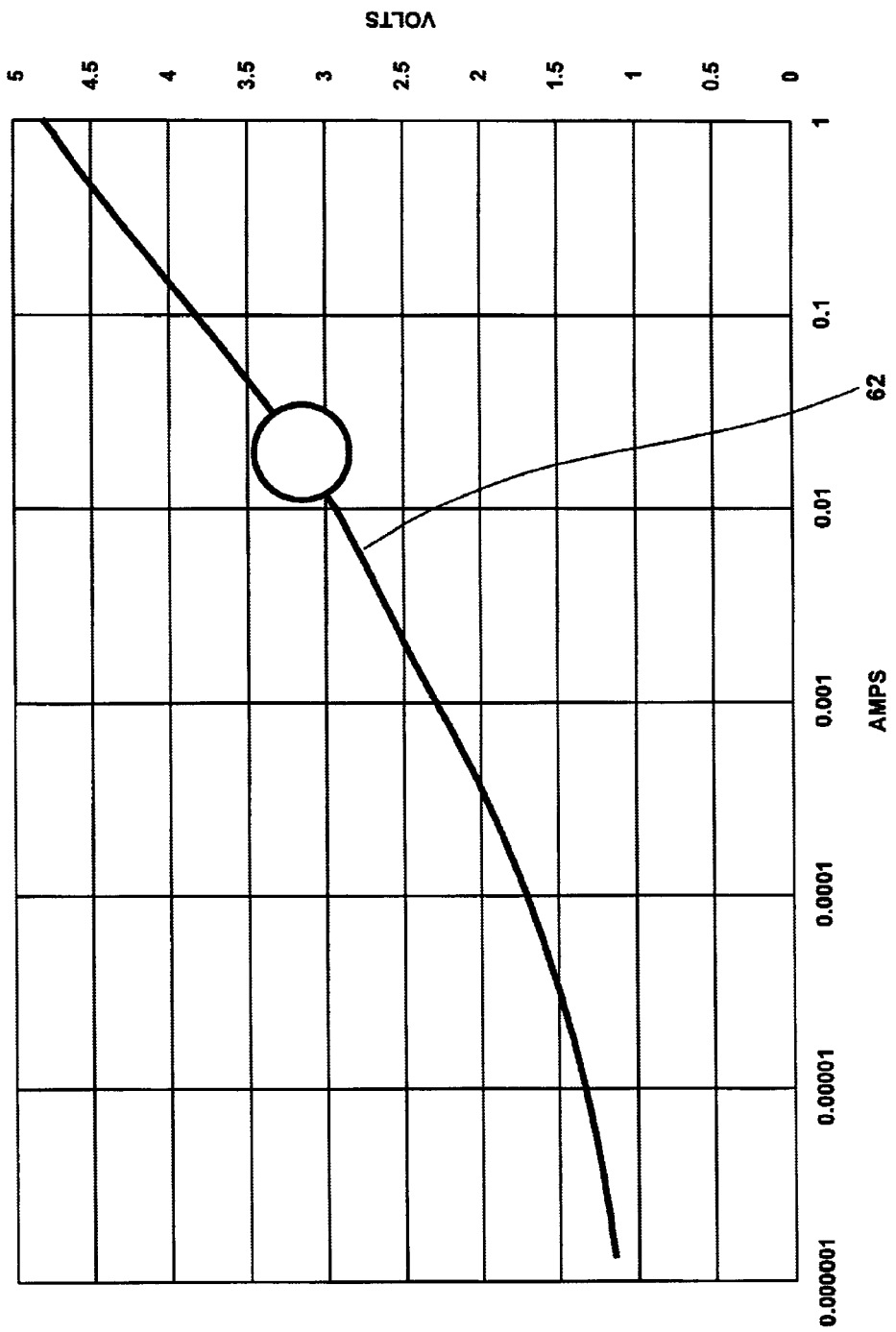
FIG. 5 is an enlarged view of the curve on the front view shown in FIG. 2, illustrating the typical orders of magnitude variation of current to voltage characteristic curve of the selected silicon diode isolater for the 15/20 ampere unit.
Figure 5A:
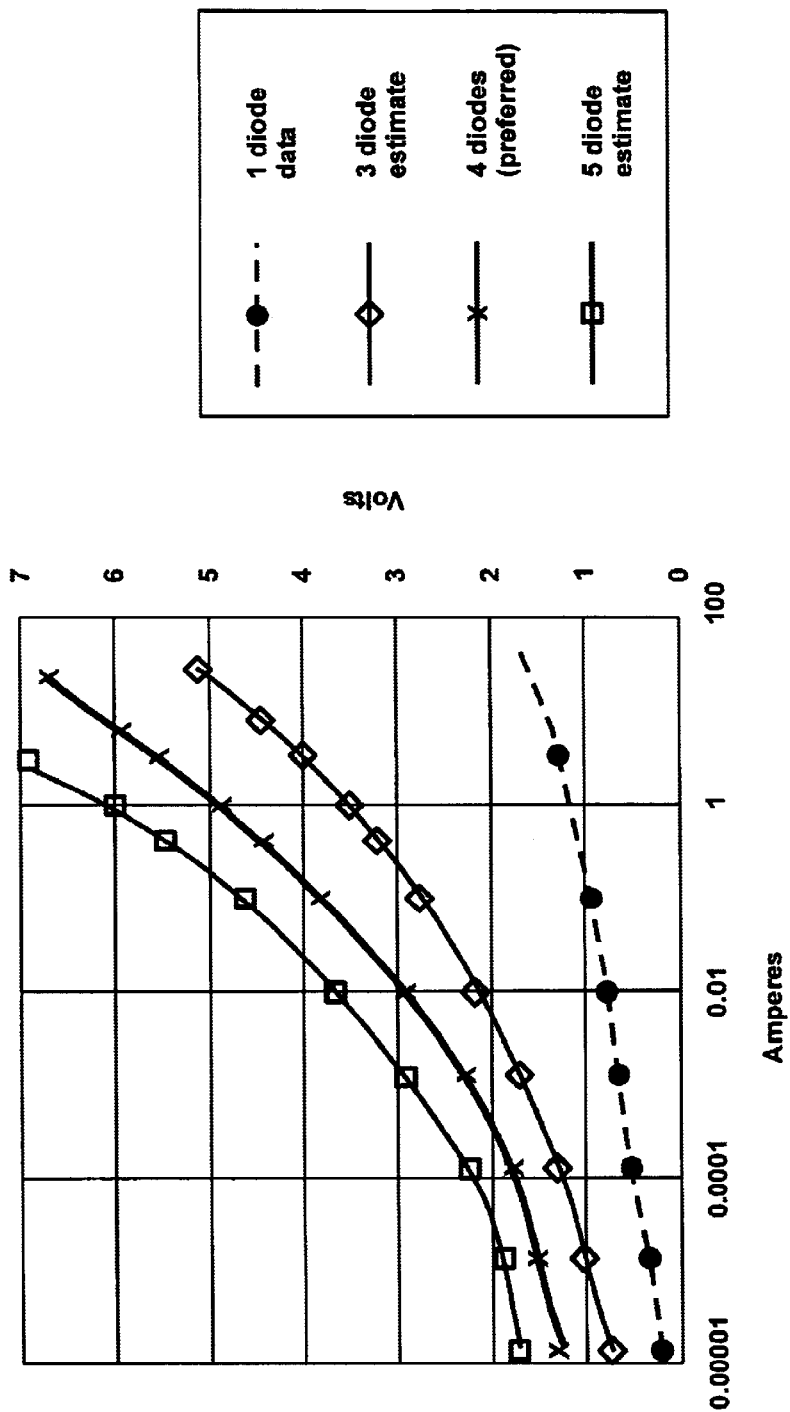
FIG. 5A is a series of design optimization curves illustrating the voltage current relationship selection criteria for an appropriate number of diodes to provide safety.

An over-voltage indication on the safety ground line is indicated by illumination of the ground over-voltage light 80, shown schematically in FIG. 1, configuration in FIGS. 3A and 3B, and in application in FIG. 9. Testing for progressive deterioration over time, or trouble shooting in accordance with the attached test procedures, is supported using an ordinary Volt-Ohm-Meter connected to test points 41 and 51. The voltage may be measured directly, and residual current determined from the graph 62 shown in FIG. 2, with current values on the X-axis, and voltage values on the Y-axis. FIG. 5 shows a representative curve 62 in more detail. Supporting data for the various representative current rated devices is shown in FIG. 5A. The low voltage level for human safety at these levels, is generally accepted as safe and is usually even undetectable by human beings. Although at these low voltage levels, ground currents being passed through a life-threatening portion of a human subject are unlikely, currents in excess of 15 milliamperes are considered potentially dangerous to human life. These levels of ground currents coincide with the onset of significant electrolytic corrosion in the typical marine environment. The T/I ground over-voltage/current indicator, as well as the GFCI current unbalance disconnect are each set independently at approximately this 15-ma level. Current that would have caused electrolytic corrosion without the T/I installed, plus the voltage and residual current with the T/I installed, passing into or out of the boat through the AC safety-grounding system can be readily determined with the T/I by the two test points provided. The T/I built in test points are Marina Safety Ground, and boat AC Safety Ground. Without moving the test leads, both the voltage and the current that would flow had the device not been installed, may be directly measured. This allows the owner to determine if he is depleting his underwater metal parts due to other boats being hooked into the AC system, or if other boats active elements are protecting his boat. An additional test benefit is the ability to assess the extent of degradation to the intended protective elements, typically zincs, while the boat is still in the water.

In addition to the test button incorporated within the GFCI for a low level current unbalance test, a GFST validation device is included to periodically test the continued proper operation of all the ground fault circuitry. Since a complete plugin unit has not been found available on the open market, it is included as part of the supplied test equipment package. In as much as procedures are an important part of demonstrating the usefulness of this device, copyrighted test procedures identified as "Boat Electrical Test/Isolator Test Procedure copyright Donald G. Funderburk 2001 is hereby incorporated into the present application by this reference as if fully set forth herein.

This unit is unique in that it protects at the source of power for the boat, i.e. at the dock distribution connection, from multiple types of faults, and is intended to be installed external to the power connector of the boat being protected. It can, however, readily be installed internal to the boat at the electrical service connection, reducing the chances of failure caused by mis-wiring inside the boat over a distributed protection system. It is particularly effective when used as multiple units in a Marina or interconnected harbor area, or as a testing unit, screening newly arriving boats thus preventing damage to the new boat, personnel, and boats already in the harbor.

The T/I protects in three major ways:

1) By providing a very high impedance path for both the low voltage AC that unintentionally exists on harbor supplied AC electrical safety ground lines, and for the low voltage DC, commonly called galvanic action, that many times exists between boats in the harbor, due to the harbor safety ground interconnect between the boats. Both of these currents contribute to electrolytic corrosion due to their presence. This unintentional electrolytic corrosion current between boats is typically due to: improper wiring; interconnect of AC and DC ground systems on one or more of the boats connected to the power system; leakage current on one or more boats; by high demand AC loads in a harbor; or by the large area distribution network. The safety ground current isolation is provided at the boat being protected through multiple non-linear series elements. This design retains the purpose of the safety ground, which is to protect humans from accidental grounding electrocution, while isolating ground currents between boats at electrolytic corrosion levels. Traditional marine single diode pair isolators internal to the boat are typically limited to approximately 1 volt DC due to galvanic action, and typically by-passed for AC with a capacitor. The proposed T/I multiple diode isolator element also functions at the AC voltage levels typically present in safety ground lines, while providing dramatically improved electric current isolation (which is indicative of the rate of metal displacement damage) at DC galvanic corrosion levels.

2) It protects personnel, the boat, and others in the marina by electrically disconnecting the boat from the marina electrical supply by sensing the presence of a ground fault current unbalance between supply and return lines using an integral conventional Ground Fault Current Interrupter (GFCI). Ground fault currents actively destroy underwater conductive or metallic parts of the boat by electrolytic corrosion, as well as electrocute persons both in the water and on and around the boat. Note that this protection is a fundamentally different failure protection phenomenon than the gross overload protection commonly provided by conventional circuit breakers. It is common practice, for the harbor to include circuit breaker protection, so no attempt is made to supplement this protection.

3) The complete unit, together with identified test procedures, may be used to test for and isolate the extent and cause of electrical problems that could damage all boats plugged into electrical shore power. These problems may be induced by other boats hooked into the electrical network, or caused by equipment that has failed, or is improperly wired at the marina, from other boats at the marina, or within the boat intended to be isolated A supplementary test device identified as a GFST is shown schematically in FIG. 8, and in application in FIG. 9. The device consists of an ordinary light bulb 90 with typically a tungsten filament 92, configured in an ordinary outdoor plug, but connected only to safety ground 96 and hot line 94. The normal neutral return line 98 has no connection (n.c.). This configuration, when used as proposed herein with the GFCI in the T/I, introduces a very short period (milliseconds) high current ground fault delivered to the output of the T/I. Due to the on period being so short, the filament does not stabilize at it's high temperature and high resistance operating value, hence draws considerably more current than ordinary ratings would dictate. Given proper operation from the power source, typically a power utility transformer remotely located, all the way through dock wiring to the output of the T/I, a high current ground fault is introduced. This confirms proper operation for the entire safety ground system, including the low voltage isolator device, and the GFCI, at the boat service connector.

In one embodiment, the unit is attractive commercially because it can replace the typically 30 to 50 foot long traditional shore power service cord at a price competitive with unprotected service cords, in addition to also providing safety protection. It can also provide a commercially attractive option of supplying an additional pair of external 15/20 amp service outlets, without having to request and pay for additional dock service outlets, a common concern for small boats.

While the present invention has been described as a test, isolation, and safety system to protect equipment and personnel in a boat and marina environment, it will be apparent to those skilled in the art that the test methods and apparatus of the present invention are also directly applicable to systems in other environments. For example, recreational vehicles are directly applicable, even using common electrical service connectors. Portable or temporary buildings are similarly situated and subject to similar personnel and ground current damage.

What is claimed is:

1. Apparatus for testing an electrical supply system comprising:
    first means for testing the proper wiring of said electrical supply system, wherein at least a portion of said means for testing said electrical supply system comprises a Ground Fault Current Interrupter (GFCI);
    second means for providing a low voltage, high impedance path for monitoring and preventing both AC and DC damaging high ground current flow between said electrical supply system and a boat hooked to said system; and
    third means for automatically disconnecting said supply system if there is unsafe ground current leakage caused by a boat load.

2. Apparatus for testing an electrical supply system according to claim 1 wherein said first means for testing said supply electrical supply system comprises a display for testing the AC portion of said electrical supply system.

3. Apparatus for testing said electrical supply according to claim 1 wherein said means for automatically disconnecting said electrical supply system comprises at least in part a GFCI.

4. Apparatus for testing said electrical supply system according to claim 1 wherein said means for providing a low voltage, high impedance path comprises an opposite polarity connected pair of at least four diodes connected in series in each of said pairs.

5. Apparatus for testing said electrical supply system according to claim 4 including means for indicating a failure condition in said electrical supply system and said boat load system.

6. Apparatus according to claim 5 including means for providing additional testing of said electrical supply system and said boat load system.

7. Apparatus for testing said electrical supply system according to claim 4 wherein said first and said second pair of diodes also includes at least one additional diode and at least one light emitting diode (LED) as an indicator.

8. Apparatus for testing of an electrical system according to claim 6 including means for testing voltage and current flow, and means for determining current flow.

9. Apparatus for testing of an electrical system according to claim 1 including means for testing voltage and current flow, and means for determining current flow.

10. A method for testing a marina electrical supply system having AC lines and a marina wiring system for marine vehicles for personnel safety and avoiding electrical damage to components of said marine vehicle by the said marina electrical supply system comprising: providing a marine vehicle testing system including a receptacle; a low voltage, high impedance path for any damaging high currents in said marina electrical supply system; and means for disconnecting said marina electrical supply system if the supply current, as measured by unbalanced current, exceeds a predetermined value; connecting said marina electrical supply system to said marine vehicle testing system receptacle; testing said marina wiring system for proper wiring hookup of said marina electrical supply system to prevent any damaging high currents to pass through said low voltage, high impedance path in said marina electrical supply electrical system; and disconnecting said marina electrical supply system if the supply current leakage, as measured by unbalanced current, exceeds a predetermined value.

11. A method according to claim 10 for testing said marina electrical supply system including providing a GFCI having a sensing mechanism and a solenoid with a contactor connected between said GFCI and said solenoid and connecting said GFCI to said marina supply system AC lines.

12. A method for testing said marina electrical supply system according to claim 10 including testing the voltage across said low voltage high impedance path.

13. Apparatus for testing of an electrical supply system according to claim 1 including a high current ground fault simulation validation device.

14. Apparatus for testing of an electrical supply system according to claim 1 comprising a service cord also providing safety protection.

15. Apparatus for testing of an electrical supply system according to claim 14 wherein said service cord includes an additional pair of 15/20 amp service outlets.

16. Apparatus according to claim 1, including a means to connect said device to a marina power source.

17. Apparatus according to claim 1 including additional service outlets.

18. Apparatus according to claim 17 wherein said service outlets are 15/20 amp service outlets.

* * * * *